United States Patent [19]

Donohue

[11] Patent Number: 4,585,580
[45] Date of Patent: Apr. 29, 1986

[54] THICK FILM COPPER COMPATIBLE RESISTORS BASED ON HEXABORIDE CONDUCTORS AND NONREDUCIBLE GLASSES

[75] Inventor: Paul C. Donohue, Wilmington, Del.

[73] Assignee: E. I. Du Pont de Nemours and Company, Wilmington, Del.

[21] Appl. No.: 934,269

[22] Filed: Aug. 16, 1978

[51] Int. Cl.$^4$ .......................... H01B 1/00; H01B 1/06
[52] U.S. Cl. .................................... 252/517; 252/518; 252/520; 252/521
[58] Field of Search ............... 252/517, 518, 520, 521; 428/901, 432; 106/1.05, 1.22, 1.25

[56] References Cited

U.S. PATENT DOCUMENTS 3,770,478  11/1973  Bishop ........................... 428/483 X

FOREIGN PATENT DOCUMENTS 1282023  7/1972  United Kingdom .

OTHER PUBLICATIONS

Valeev, Kh. S. et al, Chemical Abstracts 85 (1976), 135965u, "Semiconductor Ceramic Material for Producing Volume-Type Resistors".

Smirnov, M. A. et al, Chemical Abstracts 79 (1973), 109218j, "Resistance Material Made of Lanthanum Hexaboride and Glass".

Primary Examiner—Josephine L. Barr
Attorney, Agent, or Firm—George A. Frank

[57]  ABSTRACT

Thick flim resistors and conductors compatible with copper and fireable in nonoxidizing atmosphere are provided. The resistors are based on certain hexaboride conductors such as LaB$_6$ and glasses which are thermodynamically stable to or nonreducible by the hexaborides. Thick film pastes prepared with small particle size hexaboride and certain ethylene-vinyl acetate polymeric vehicles afford resistors having improved temperature coefficient of resistance and coefficient of variation.

33 Claims, 1 Drawing Figure

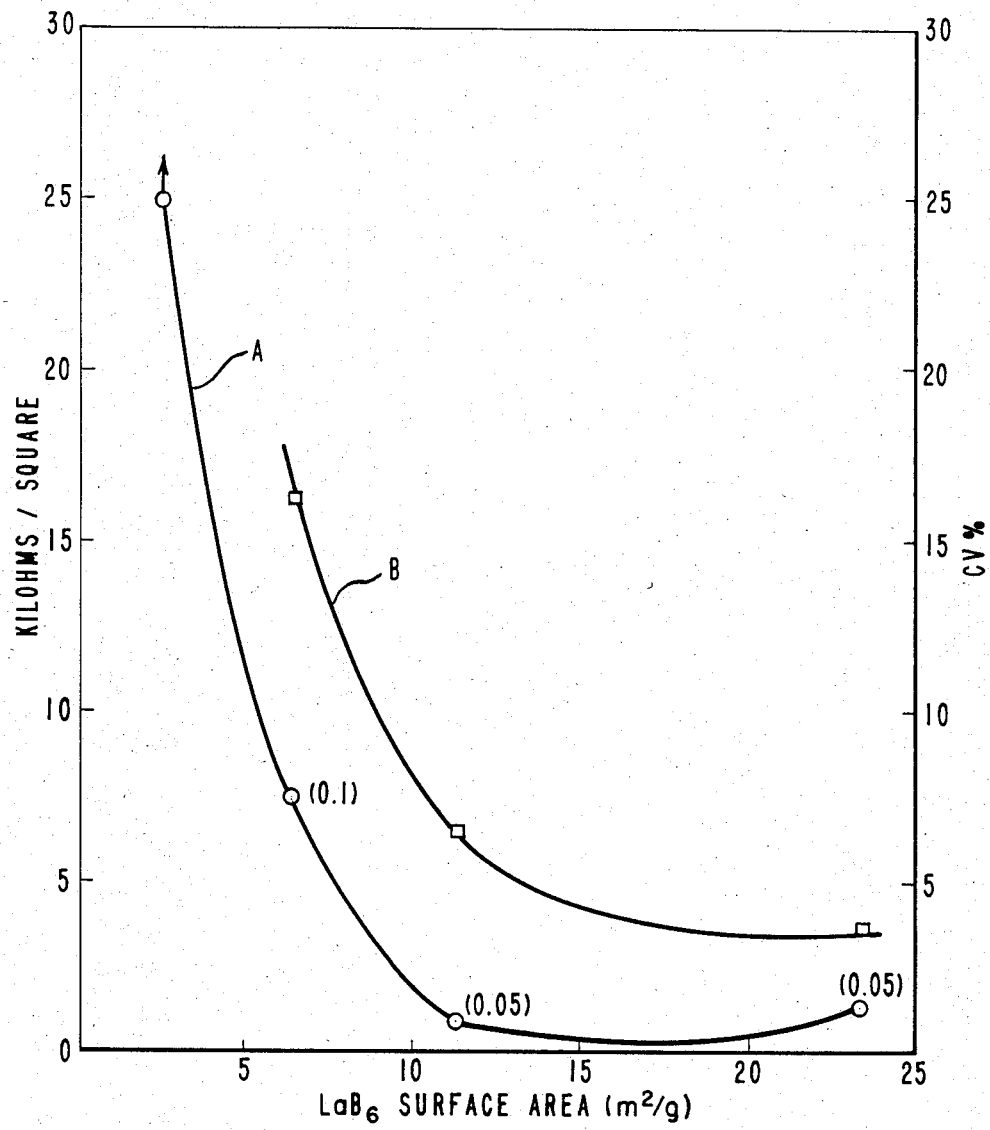

THICK FILM COPPER COMPATIBLE RESISTORS BASED ON HEXABORIDE CONDUCTORS AND NONREDUCIBLE GLASSES

DESCRIPTION

1. Technical Field

This invention relates to thick film copper compatible resistors and more particularly to thick film resistors based on hexaborides, nonreducible glasses and ethylene-vinyl acetate vehicles.

2. Background Art

Resistor and conductor compositions which are applied to and fired on dielectric substances (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the film, the metallic component of the composition provides the functional (resistive or conductive) utility, while the inorganic binder (e.g., glass, crystalline oxides such as $Bi_2O_3$, etc.) bonds the metal particles to one another and to the substrate. Thick film techniques are contrasted with thin film techniques which involve deposition of particles by evaporation or sputtering. Thick film techniques are discussed in "Handbook of Materials and Processes for Electronics", C. A. Harper, Editor, McGraw-Hill, N.Y., 1970, Chapter 12.

Since copper is an economical electrode material, there is a need for thick film resistor systems compatible with copper and fireable in nonoxidizing atmosphere having properties comparable to air fired resistors. Lanthanum hexaboride and hexaborides of alkaline earth and rare earth metals, in general, compatible with copper at elevated temperatures, have been used as cathodes. J. M. Lafferty, in Journal of Applied Physics, 22(3), 299-309 (1951), describes the use of these hexaborides as cathodes at high temperatures and their use in paste forms with annyl acetate.

Izvestia Vysshikl Uchebnykl Zavedenii, Nefti y Gaz, 16(6), 99-102 (1973) discloses thick film resistors based on relatively coarse $LaB_6$ and borosilicate glass. These resistors are said to be resistant to hydrogen gas, however the films are moisture sensitive.

British Patent No. 1,282,023, published July 19, 1972, discloses electrical resistor dispersions containing rare earth or alkaline earth hexaboride conductive pigment and glass phase in ethyl cellulose vehicle. Thick film resistors, prepared from these dispersions, however, often have unacceptably high temperature coefficient of resistance and are often unstable in oxidizing and humid atmosphere.

DISCLOSURE OF THE INVENTION

The thick film resistor and conductor compositions of this invention are compatible with copper metallization conductors, are fireable in nonoxidizing atmosphere, and consist essentially of a mixture of inorganic powders containing conductive material such as lanthanum hexaboride ($LaB_6$), yttrium hexaboride ($YB_6$), the rare earth hexaborides, calcium hexaboride ($CaB_6$), barium hexaboride ($BaB_6$), strontium hexaboride ($SrB_6$), or mixtures thereof and a nonreducible glass having a Gibbs free energy of formation $\Delta F°$, of 900° C., of less than approximately $-78$ kcal/mole (per each metal-oxygen bond in the molecule), dispersed in an inert liquid vehicle such as based on copolymers of ethylene-vinyl acetate having not less than 53% by weight of vinyl acetate.

The weight ratio in the solids of the hexaboride to glass is from 10:90 to 95:5 while the weight ratio of solids to vehicle is from 1:2 to 20:1.

BRIEF DESCRIPTION OF THE DRAWING

The FIGURE shows the relationship of $LaB_6$ particle size to resistivity and coefficient of variation, respectively.

DESCRIPTION OF THE INVENTION

The inorganic solids content of the resistor and conductor composition of this invention contains 10-95 parts by weight, based on the solids content, of a conductive material such as $LaB_6$, $YB_6$, the rare earth hexaborides, $CaB_6$, $BaB_6$, $SrB_6$ or mixtures thereof.

Although the above empirical formulae are used throughout this description, it is understood that the stoichiometry of these compounds is somewhat variable and is thought to be, e.g., for lanthanum hexaboride, $La_{0.7-1}B_6$.

Depending on the amount of hexaboride and the complementary amount of nonreducible glass, the compositions fulfill the function of either that of resistor or that of conductor. For the sake of simplicity, these compositions will be referred to as resistor compositions.

Among the hexaboride conductors the preferred one is lanthanum hexaboride.

While it was not anticipated that the particle size of the hexaborides, prior to sintering to obtain the thick film resistors, would affect the electrical properties of the resistors, it was unexpectedly found that, in order to obtain low coefficient of variation and good surface smoothness, the hexaboride particle size must be below one micrometer (micron). Preferably, the average particle size is between $0.055\mu$ and $0.32\mu$ and, even more preferably, the average particle size is approximately $0.2\mu$. The particle size referred to above can be measured by a Coulter Counter or can be calculated, assuming spherical particles, from the equation below:

$$\text{particle diameter } (\mu) = \frac{6}{\text{surface area } (m^2/g) \times \text{density } (g/cm^3)}$$

The surface area can be determined by customary methods such as measuring weight gain after equilibrium gas adsorption by the particles. For $LaB_6$, the density is 4.72 $g/cm^3$. Substituting into the above equation, the surface area for $LaB_6$ has to be larger than approximately 1 $m^2/g$, while the preferred surface area range is approximately 4-23 $m^2/g$, with the more preferred value being approximately 6 $m^2/g$. To obtain the fine particle size hexaborides of this invention from commercially available coarser materials, e.g., $5.8\mu$ for $LaB_6$, they are usually vibratorily milled. Vibratory milling is carried out in an aqueous medium by placing the inorganic powder and alumina balls into a container which is then vibrated for a specified length of time to achieve the desired particle size.

The effect of the particle size (surface area) of the hexaboride on the coefficient of variation, surface roughness and resistivity is shown in the FIGURE.

Curve A shows the relationship between $LaB_6$ surface area and the resistivity of the particular thick film resistors made therefrom, with the surface roughness of the films indicated parenthetically at each data point. Surface roughness is measured by a commercial instrument, the Gould surfanalyzer, which records surface profile, thickness values, and surface roughness.

Curve B shows the relationship between surface area and the coefficient of variation for the same composition. The coefficient of variation (CV) is expressed in percentages and is calculated by dividing the standard deviation by the mean and multiplying by 100. Maximum acceptable values for CV are $\leq 15\%$ but preferably $\leq 10\%$ and most preferably $\leq 5\%$.

The composition utilized for the above measurements is $LaB_6$ (23.3% by weight)/glass (76.7% by weight), dispersed in a hydroxy-terminated polybutadiene/-polyiso-butyl methacrylate-based vehicle. These compositions are printed, dried, and fired as described below.

The inorganic solids content of the resistor composition of this invention contains 90–5 parts by weight, based on the solids content, of a nonreducible glass and preferably 50–15 parts. The relative amount of hexaboride to glass are determined by the desired final resistivity of the thick film resistors.

It is known that hexaborides such as $LaB_6$ are strong reducing agents; their reaction with metal oxides (MO) is shown below:

$$LaB_6 + 10.5\ MO \rightarrow 0.5\ La_2O_3 + 3\ B_2O_3 + 10.5\ M$$

Based on thermodynamic calculations and approximations, the Gibbs free energy of formation, $\Delta F°$, will be zero (at 900° C., the approximate average temperature at which the thick film resistor films are formed from the compositions of this invention) when $\Delta F°$ (M−O) is approximately −80.8 kcal/mole. (The thermodynamic data utilized herein are based on tabulations in Bulletin 542, Bureau of Mines, "Contributions to the Data on Theoretical Metallurgy: XII. Heats and Free Energies of Formation of Inorganic Oxides" by J. P. Coughlin, 1954. $\Delta F° LaB_6$ was estimated to be approximately 10% less than its reported $\Delta H°$ of −30.7 kcal/mole; see Chem. Abstr., 70:61844 v.) Based on the above equation and on data from the tabulation:

−28 kcal/mole+10.5 $\Delta F°$(M−O)→0.5(−344 kcal/mole)+3(−234.7 kcal/mole)+0
$\Delta F°$(M-0)=−80.8 kcal/mole.

Unexpected superiority, over resistors of the prior art, in electrical properties, especially temperature coefficient of resistance (TCR), was found when the nonreducible glasses of this invention were used to prepare the resistor compositions of this invention.

As can be seen in the comparative Examples 13–16, resistors prepared according to British Patent No. 1,282,023, Examples 1 and 3, lead to unacceptable properties such as large TCR values, positive or negative, excessive CV, and high drift in humid atmospheres. These resistors were based on resistor compositions comprising relatively coarse (approximately 5.8$\mu$) $LaB_6$, reducible glass, and ethyl cellulose vehicle. Even when the prior art ethyl cellulose vehicle was removed from the composition and an ethylene-vinyl acetate vehicle (which is more fully described in copending application Ser. No. 934,271, filed Aug. 16, 1978, concurrently with the instant application, was substituted in its place, the electrical properties, although improved, were not acceptable for most applications. This indicates the need for the presence in the resistor compositions of this invention of all claimed components.

It is believed that there are at least two factors contributing to the inferiority of the electrical properties of the prior art resistors. First, the presence of reducible glasses, containing reducible oxides such as PbO among others, can lead to an oxide coating on the hexaboride conductor causing excessive deviation of TCR values from zero. X-ray diffraction studies of resistors of these comparative Examples showed $LaB_6$, substantial amounts of Pb metal, indicating reduction of PbO and at least partial oxidation of $LaB_6$, the only reducing agent present. Such resistors also show excessive drift when exposed to humid atmosphere (90% relative humidity/40° C./100 hrs. is standard test). This is probably due to hygroscopic oxidized products such as free $B_2O_3$ and $La_2O_3$.

Second, very high negative TCR values can also result from the incomplete burning, in a nonoxidizing atmosphere, of the ethyl cellulose vehicle which leads to residual carbon. The ethylene-vinyl acetate polymeric vehicles utilized in this invention alleviate this particular problem.

TCR is an important characteristic of electrical resistors. In general, thick film resistor compositions have, unless modified, relatively large positive TCR values at the low resistivity range of the resistor films and negative values in the high resistivity range. Such behavior is thought to occur because of the domination of the metallic functional phase in the low resistivity range while, in the high resistivity range, the semiconducting characteristic of the functional phase-glass junctions dominate.

It has been found unexpectedly, however, that the resistor compositions of this invention, in addition to affording resistors of low coefficient of variation which do not produce a visible stain when used with copper metallizations, also provide resistors of acceptable TCR. Although no absolute maximum acceptable TCR values have been generally established, it is thought that resistors having a TCR value outside of the ±350 ppm/°C. range, without TCR modifiers, are unacceptable. Especially effective TCR modifiers for the resistor compositions of this invention are described in copending patent application Ser. No. 934,271, filed Aug. 16, 1978 and include TiO, Ge, Si and C. These can be included to the extent of 1–20 parts by weight based on the inorganic solids.

Among component oxides of the nonreducible glasses of this invention are the following, showing the $\Delta F°$ (M−O) values at 1200° K. in Kcal/mole per metal-oxygen bond in parentheses: CaO (−121), $ThO_2$(−119), BeO (−115), $La_2O_3$(−115), SrO(−113), MgO (−112), $Y_2O_3$(−111), rare earth oxides, $Sc_2O_3$ (−107), BaO(−106), $HfO_2$(−105), $ZrO_2$(−103), $Al_2O_3$(−103), $Li_2O$(−103), TiO(−97), $CeO_2$(−92), $TiO_2$(−87), $SiO_2$(−80), $B_2O_3$(−78). $SiO_2$ and $B_2O_3$ are borderline in reducibility in this scheme but probably receive additional stabilization during glass formation ano therefore can be included.

There appears to be a real separation of the above category of oxides, at the approximate $\Delta F°$ cutoff value of approximately −78 kcal/mole, from those oxides which are reducible by the hexaborides.

Representative reducible oxides permitted to be present in the nonreducible glasses of this invention to a small extent not to exceed approximately mole %, are listed below: $Cr_2O_3(-65)$, $Na_2O(-59)$, $ZnO(-53)$, $K_2O(-37)$, $CdO(-28)$, $PbO(-24)$, $Bi_2O_3(-19)$.

The presence, e.g., of 2 mole % PbO in an otherwise nonreducible glass advantageously lowers the incipient gloss temperature (determined in a gradient oven on a glass/vehicle system printed on a substrate, after equilibrium temperature has been reached) without adversely affecting other electrical properties.

Preferred glasses are listed below (mole % range): $M^{\pi}O$ (10-30, $M^{\pi}$ is Ca, Sr, Ba), $SiO_2$(35-55), $B_2O_3$(20-35), $Al_2O_3$(5-15), $ZrO_2$(0-4), $TiO_2$(0-1), $Li_2O$(0-2). Calcium is the preferred $M^{\pi}$. An especially preferred glass is prepared from (mole %) CaO(12.7), $SiO_2$(46.66), $B_2O_3$(25.4), $Al_2O_3$(12.7), $ZrO_2$(2.03), and $TiO_2$(0.522).

These glasses are prepared by conventional glass-making techniques, by mixing the desired components (or precursors thereof, e.g., $H_3BO_3$ for $B_2O_3$) in the desired proportions and heating the mixture to form a melt. As is well known in the art, heating is conducted to a peak temperature and for a time such that the melt becomes entirely liquid, yet gaseous evolution has ceased. In this work, the peak temperature is in the range 1100°-1500° C., usually 1200°-1400° C. The melt is then fritted (particles are made) by cooling the melt, typically by pouring onto a cold belt or into cold running water. Particle size reduction can then be accomplished by milling as desired.

The above mentioned glass can be conveniently prepared by melting, at 1400°-1500° C. in a platinum or Kyanite crucible, the appropriate amounts of $H_3BO_3$, $SiO_2$, $Al_2O_3 \cdot 3H_2O$, $CaCO_3$, $ZrO_2$, and $TiO_2$. Alternatively, $CaZrO_3$ and $CaTiO_3$ can also be used as the precursors of $ZrO_2$ and $TiO_2$, respectively, and as the partial source of CaO.

The surface area of the nonreducible glasses is not critical but is preferably in the range of 2-4 $m^2/g$. Assuming a density of approximately 3 $g/cm^2$, this range corresponds to an approximate particle size range of 0.5-1$\mu$. A surface area of 1.5 $m^2/g$ (approx. 1.3$\mu$) can also be utilized.

The hexaboride-nonreducible glass mixture of this invention is dispersed in an inert liquid vehicle.

Any inert liquid can be used as the vehicle. Water or any one of various organic liquids, with or without thickening and/or stabilizing agents and/or other common additives, can be used as the vehicle. Examplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle can contain or be composed of volatile liquids to promote fast setting after application to the substrate.

One particularly preferred vehicle is based on copolymers of ethylene-vinyl acetate having not less than 53% by weight of vinyl acetate, to form a resistor composition paste.

The preferred ethylene-vinyl acetate polymers to be utilized in vehicles for this invention are solid, high molecular weight polymers having melt flow rates of 0.1-2 g/10 min. The above vinyl acetate content limitation is imposed by the solubility requirements, at room temperature, of the polymer in solvents suitable for thick film printing.

Such vehicles are described in copending application to D. H. Scheiber, Ser. No. 934,271, filed Aug. 16, 1978 concurrently with the instant application. This application is hereby incorporated by reference.

The weight ratio of solids to vehicle is from 1:2 to 20:1, preferably the conductor compositions contain 10-35% of vehicle.

The ratio of inert liquid vehicle to solids in the resistor compositions of this invention can vary considerably and depends upon the manner in which the dispersion of resistor composition in vehicle is to be applied to the kind of substrate used.

The resistor compositions are prepared from the solids and vehicles by mechanical mixing. The resistor compositions of the present invention are printed as a film onto ceramic, alumina or other dielectric substrates in the conventional manner. Generally, screen stenciling techniques are preferably employed. The resulting printed patterns are generally allowed to level out, dried at elevated temperatures such as at 120° C. for approximately 10 minutes, and fired in nonoxidizing atmosphere in a belt furnace at a peak temperature of approximately 910° C.

Preferably, a nitrogen atmosphere is employed in the furnace but other nonoxidizing gases such as hydrogen or a mixture of hydrogen and carbon monoxide can also be used. Also, small quantities of oxygen can also be present during the firing without adversely affecting the final resistor properties. It is believed that a maximum of approximately 100 parts per million of oxygen is permissible; above this level, oxygen appears to have a TCR modifier effect. It is thought that oxygen induces metal oxide formation at the conductor-conductor interfaces imparting semiconducting characteristics to regions of the compositions and thereby acting as a negative TCR modifier. It is, however, possible that depending on the exact nature of hexaboride, glass, and vehicle, higher levels of oxygen can be tolerated without any adverse effect. The preferred range of oxygen content in the nitrogen atmosphere is 3-30 ppm.

Resistance measurements can be carried out in a two-probe procedure utilizing a digital ohmmeter.

TCR measurements are carried out by measuring resistivities ($R_E$; $R_{RT}$) at elevated temperatures ($T_E$) between 125° C. and 150° C. and at room temperature ($T_{RT}$). TCR is calculated from the following formula; in units of ppm/°C.:

$$TCR = \frac{R_E - R_{RT}}{R_{RT}(T_E - T_{RT})}$$

Often, for better comparison, the measured resistivities are normalized to a uniform thickness.

Film thickness (and, also, surface roughness of the films) is measured by a commercial instrument, the Gould surfanalyzer, which records surface profile, thickness values, and surface roughness.

In the Examples below, illustrating the invention, all parts are by weight unless otherwise indicated.

EXAMPLES

Examples 1-3

A series of resistor compositions is prepared containing varying amounts of $LaB_6$ and nonreducible glass. The glass is based on the following constituents (mole %): $B_2O_3$(25.4), $SiO_2$(46.66), $Al_2O_3$(12.7), CaO (12.7), $ZrO_2$(2.03), and $TiO_2$(0.52). The actual ingredients are as follows: $H_3BO_3$(173.1 grams), $SiO_2$(154.5 grams), $Al_2O_3 \cdot 3H_2O$ (109.2 grams), $CaCO_3$(70 grams), $ZrO_2$(13.8 grams), and $TiO_2$(2.3 grams). The ingredients are ball milled with alumina balls, wet, for seven hours, sifted through a 400-mesh screen, filtered and dried. After drying, the components are melted at between 1450° C. and 1500° C. in a platinum crucible and the molten glass is fritted by pouring into cold water followed by crushing and grinding by conventional wet-ball milling procedure.

$LaB_6$ utilized in these experiments is obtained commercially and vibratorily milled for 6.5 hours to a surface area of approximately 8 $m^2/g$. (Vibratory milling is carried out in an aqueous medium by placing inorganic powders and alumina balls into a container which is then vibrated for a specified length of time.)

The resistor compositions are parpared into paste form by dispersing $LaB_6$ and glass in the vehicle by Hoover mulling. The dispersions contain varying ratios of $LaB_6$ and glass as shown in the tabulation below.

The vehicle is a solution of an ethylenevinyl acetate (45/55 by weight) polymer, havinq a melt flow rate of 1.0, dissolved in hexyl carbitol to provide a 13.8% by weight solution. The vehicle comprises 30.23% by weight of the total resistor composition. This vehicle is described in copending application Ser. No. 934,271, filed Aug. 16, 1978, by Scheiber.

The following is the tabulation of the quantities (g.) utilized in preparing the various samples. (The numbers in parentheses indicate the weight ratios of the components in the final paste.)

| Ex-<br>am-<br>ple | $LaB_6$ | glass | Vehicle | | |
|---|---|---|---|---|---|
| | | | poly-<br>mer | + solvent = | total |
| 1 | 1.1 (25.5) | 1.9 (44.1) | 0.18 | 1.12 | (30.23) |
| 2 | 0.85 (19.7) | 2.15 (50.0) | 0.18 | 1.12 | (30.23) |
| 3 | 0.68 (15.8) | 2.32 (53.95) | 0.18 | 1.12 | (30.23) |

The resistor compositions prepared above are screen printed over prefired copper electrodes using 325-mesh screens, allowed to level for 10 minutes, dried at 120° C. for 10 minutes, and fired in a belt furnace in a nitrogen atmosphere containing 25-30 ppm of oxygen in the burn-out zone and 3-10 ppm of oxygen in the firing zone. The total firing cycle is 56 minutes, reaching a peak temperature of 910° C. for 6-8 minutes, at a rate of temperature rise and fall of approximately 80°-100° C./minute.

The resistivity values are measured as described above, the TCR values are calculated using the equation shown above, coefficient of variation (CV, %) is calculated from the equation shown above, and humidity drift is measured at 90% relative humidity at 40° C. for 100 hours. Values are tabulated below:

| Ex. | Resistivity<br>(kilo ohm/sq.) | TCR<br>(ppm/<br>°C.) | CV<br>(%) | Humidity<br>drift<br>(%) | Thick-<br>ness<br>(mil) | Rough-<br>ness<br>(mil) |
|---|---|---|---|---|---|---|
| 1 | 0.0679 | 335 | 4.0 | 0 | 0.6 | 0.17 |
| 2 | 0.6336 | 250 | 6.5 | 0.10 | 0.5 | 0.11 |
| 3 | 24.1 | −101 | 15.0 | 0.27 | 0.75 | 0.10 |

As can be seen from these data, the resistor compositions have acceptable TCR values and low coefficients of variation.

Example 4

This example shows that improved coefficient of variation at the high resistivity range can be obtained by prereacting $LaB_6$ and glass. $LaB_6$(17.4 grams), the glass utilized in Examples 1-3 (46.6 grams) and 100 ml of water are vibratorily milled for one hour, filtered, dried and heated in an alumina boat in flowing nitrogen to 900° C. to cause sintering. The boule is broken up and vibratorily milled for four hours, filtered and dried. The paste is prepared by roll milling with the vehicle described in the above Examples. The following quantities are utilized: 25 grams of the prereacted powder, 7.5 grams of the above vehicle at 20% concentration (by weight) in hexylcarbitol and an additional 3.3 grams of hexylcarbitol. The $LaB_6$ utilized has a surface area of 4.8 $m^2/g$ and comprises 20.2 weight % of the paste. The glass comprises 49.6 weight % and the vehicle 30.2%. The resistor composition thus prepared is printed over prefired copper electrodes and is prepared into a resistor as described in Examples 1-3. This resistor has a resistivity of 61.86 kilo ohm/square, a TCR value of −355 ppm/° C., a coefficient of variation of 8.75% and a humidity drift of 0.27%. As can be seen from this example, the CV is lower than that obtained for unprereacted resistors of this high resistive range.

Example 5

This example illustrates the use of a lithium oxide ($Li_2O$) containing glass. This oxide reduces the incipient gloss temperature of the glass described in the above Examples from approximately 840° C. to 770° C. Such a reduction can be advantageous when lower temperatures are required for firing resistors. The glass utilized in this example is based on the following constituents (mole %): $B_2O_3$(25.0), $SiO_2$(46.1), $Al_2O_3$(12.8), CaO (12.5), $ZrO_2$(2.0), $TiO_2$(0.5), and $Li_2O$ (1.0). The actual ingredients are as follows: $H_3BO_3$(24.7 grams), $SiO_2$(22.08 grams), $Al_2O_3.3H_2O$ (15.97 grams), $CaCO_3$ (10.0 grams), $ZrO_2$ (2.0 grams), $TiO_2$(0.32 grams), $Li_2CO_3$(0.6 grams). The glass is prepared as described above and formed into a resistor composition containing $LaB_6$, 18.6 parts, the glass, 51.2 parts, and the vehicle used in Examples 1-3, 30.2 parts. The vehicle is 13.8% solution in hexylcarbitol. A resistor is prepared from the above composition as described in the above examples affording a resistor having a resistivity of 35 kilo ohm/square, a TCR value of −178 ppm/°C., a coefficient of variation of 20%, and a humidity drift of 0.16%. The $LaB_6$ utilized in this experiment has a surface area of 8 $m_2/g$.

Examples 6-8

Resistor compositions are prepared based on a glass having the following constituents (mole %): $B_2O_3$(25.0), $SiO_2$(46.0), $Al_2O_3$(12.5), CaO (10.5), $ZrO_2$(4.0), PbO (2.0). The actual ingredients are as follows: $H_3BO_3$(247.3 grams), $SiO_2$(220.8 grams), $Al_2O_3.3H_2O$ (156 grams), $CaCO_3$(84 grams), $ZrO_2$(39.4 grams), and PbO(35.7 grams). The glass is prepared at approximately 1500° C. A series of resistor compositions is prepared by mixing together $LaB_6$, having a surface area of 10 $m^2/g$ and the above-described glass at various levels, and an ethylene-vinyl acetate vehicle as described above, dissolved in 2,2,4-trimethylpentadiol-1, 3-monoisobutyrate. The table below shows compositions and the weight percents in parentheses.

| Example | LaB$_6$ | glass | Vehicle (16.7% by wt.) |
| --- | --- | --- | --- |
| 6 | 0.84 (19.9) | 2.16 (51.2) | 1.22 (28.9) |
| 7 | 0.72 (17.0) | 2.28 (54.0) | 1.22 (28.9) |
| 8 | 0.69 (16.3) | 2.31 (54.7) | 1.22 (28.9) |

Electrical data for the above resistors are shown in the tabulation below; the incipient gloss temperature of the glass utilized herein is 800° C.

| Ex. | Resistivity (kilo ohms/ square) | TCR (ppm/ °C.) | CV (%) | Humidity Drift (%) | Thickness (mil) | Roughness (mil) |
| --- | --- | --- | --- | --- | --- | --- |
| 6 | 0.3867 | 335 | 5.6 | 0.08 | 1.1 | 0.1 |
| 7 | 1.948 | 226 | 16.5 | 0.31 | 1.1 | 0.1 |
| 8 | 6.230 | 160 | 7.0 | 0.45 | — | — |

Example 9

A resistor is prepared based on the following glass whose composition is as follows (mole %): B$_2$O$_3$ (23), SiO$_2$ (40.2), SrO (28.7), Al$_2$O$_3$ (5.75), and ZrO$_2$ (2.3). The actual ingredients are as follows: H$_3$BO$_3$ (74.2 grams), Al$_2$O$_3$.3H$_2$O (22.5 grams), SrCO$_3$ (110.71 grams), SiO$_2$ (63 grams), and ZrO$_2$ (7.5 grams). The glass is prepared in a customary manner. Fritting is carried out from 1500° C. and is vibratory milled for six hours.

A resistor paste is prepared with lanthanum hexaboride, vibratory milled for 16 hours to provide a surface area of 12 m$^2$/g, 0.9 gram, the above glass, 2.1 grams, and vehicle 1.29 grams. The vehicle is a 23% by weight solution of polyiso-butyl methacrylate (inherent viscosity of 0.7 deciliter/gram, measured at 20° C. in a solution of 0.25 gram of polymer in 50 ml of chloroform) in 2,2,4-trimethylpentadiol-1,3-monoisobutyrate. The paste is printed and prepared into a resistor as described above affording a resistor having 20.23 kilo ohms/square resistivity, a TCR of +220 ppm/°C, a CV of 9.3%, and a thickness of 0.65 mil, at a roughness of 0.35 mil.

Example 10

A resistor composition is prepared based on a glass having the following ingredients (mole %): B$_2$O$_3$ (33), Al$_2$O$_3$ (6.7), BaO (14.9), and SiO$_2$ (44.8). The actual ingredients are as follows. H$_3$BO$_3$ (168.3 grams), Al$_2$O$_3$.3H$_2$O (42.3 grams), BaCO$_3$ (119.1 grams), and SiO$_2$ (109 grams). The glass is fritted at 1400° C. A resistor composition paste is prepared using LaB$_6$, vibratory milled to a surface area of 12 m$^2$/g, 0.7 gram, the above glass, 2.3 grams, and the vehicle described in Example 9 above, 1.5 grams. The concentration of the vehicle in this example is 23.3% by weight in the same solvent as above. The final resistor has a resistivity of 8.35 kilo ohms/square; TCR, 23 ppm/°C.; CV, 10.2%; and is 0.5-mil thick having a roughness of 0.06 mil.

Examples 11-12

A resistor is prepared based on a glass having the following constituents (mole %): B$_2$O$_3$ (26.4), SiO$_2$ (35.4), Al$_2$O$_3$ (9.54), and CaO (28.6). The actual ingredients of the glass are as follows: H$_3$BO$_3$ (163.2 grams), SiO$_2$ (106.34 grams), CaCO$_3$ (143.4 grams), Al$_2$O$_3$.3H$_2$O (74.4 grams). The glass is prepared as above. A resistor composition paste is prepared from 0.6 g. of LaB$_6$, having a surface area of 12 m$^2$/g, 2.4 grams of the above glass, and 1.3 grams of the same vehicle as utilized in Example 9, at a concentration of 25 weight %.

A similar paste is prepared from LaB$_6$, 0.51 gram, the above glass, 2.49 grams, and 1.4 grams of the above vehicle; as tabulated below (weight %):

| Example | LaB$_6$ | glass | vehicle (25% by weight) |
| --- | --- | --- | --- |
| 11 | 0.6 (13.9) | 2.4 (55.8) | 1.3 (30.2) |
| 12 | 0.51 (11.6) | 2.49 (56.6) | 1.4 (31.8) |

Electrical data for the above resistors, prepared and tested as above, are shown below:

| Example | Resistivity (Kohm/square) | TCR (ppm/°C.) | CV (%) |
| --- | --- | --- | --- |
| 11 | 21.3 | −17 | 14.6 |
| 12 | 48.7 | +35 | 9.5 |

Example 13

This is a comparative example to show that resistors prepared based on British No. 1,282,023 fall outside of the present invention and have properties which are unacceptable for most applications. In repeating Example 1 of the above patent, the following glass was utilized (weight %): PbO (54), SiO$_2$ (23.5) and B$_2$O$_3$ (22.5). The actual ingredients were as follows: H$_3$BO$_3$ (39.96 grams), PbO (54 grams), and SiO$_2$ (23.2 grams). The components were melted in a platinum crucible at 1400° C. The glass was fritted by pouring into water, ball milled for five hours, filtered, and dried. Commercial LaB$_6$ was utilized, having an average particle size of 5.8 microns. To achieve a 1:1 volume ratio of glass:LaB$_6$, the following quantities were combined: 30 parts of LaB$_6$, 38.7 parts of the above glass, and 30.3 parts of a vehicle which was an 8% by weight solution of ethyl cellulose in terpineol. The above ingredients were mulled in a Hoover muller to form a homogeneous paste and printed using the screen printer on an alumina substrate previously printed with copper electrodes, and fired on a belt furnace in a substantially pure nitrogen atmosphere at 900° C. peak temperature. The resistor so obtained had a resistivity of 37.87 kilo ohms/square, a TCR of −468 ppm/°C., and a coefficient of variation of 22%. X-ray diffraction of the fired resistor showed substantial amounts of Pb metal indicating reduction of the glass.

When the same example was repeated using a presently preferred ethylene-vinyl acetate copolymeric vehicle as described in the above Examples, the final resistor had a resistivity of 0.263 kilo ohm/square, a TCR of 637 ppm/°C., and 11.5% CV. As can be seen from the above date, using a glass outside of the present invention, i.e., glass which is reducible, the electrical properties of the resistors so obtained are unacceptable for many applications.

Examples 14-16

Example 3 of the above British patent was repeated in Example 14 and, in Examples 15 and 16, the same glass was utilized at varying ratios and with different vehicles. All of these examples again showed that a reducible glass, even when utilized with LaB$_6$, does not afford good electrical properties. The glass was prepared from the following ingredients: Li$_2$CO$_3$ (7.41 grams), Na$_2$CO$_3$ (1.71 grams), CoO (2 grams), NiO (4 grams), PbO (9 grams), Al$_2$O$_3$.3H$_2$O (18.36 grams), H$_3$BO$_3$ (71 04 grams), and SiO$_2$ (32 grams), to afford a glass having the following weight percent composition: Li$_2$O (3), Na$_2$O (1), CoO (4), NiO (4), PbO (9), Al$_2$O$_3$(12), B$_2$O$_3$(40), and SiO$_2$(32). The glass was prepared at 1400° C., fritted, ball milled, filtered, and dried. Resistor compositions were prepared utilizing the ingredients shown below.

The weight ratio for Example 13 of LaB$_6$:glass = 1:2 corresponds to a volume ratio of 1:3 as required by Example 3 of the British patent. (This conversion of weight ratio to volume ratio was accomplished in the following fashion: using a density of 4.72 g/cm$^3$ for LaB$_6$ and an average assumed density of the glass of 3.34 g/cm$^3$, calculated from the weighted average of the oxide components prior to firing, one arrives at a volume of 0.2118 cm$^3$ for 1 gram of LaB$_6$ requiring 3 times that, equaling 0.6354 cm$^3$ of glass. This corresponds to 2.12 grams of glass.)

| Example | LaB$_6$ | Glass | Vehicle |
|---------|---------|-------|---------|
| 14 | 23.2 | 46.5 | 30.3[1] |
| 15 | 17.6 | 52.0 | 30.4[1] |
| 16 | 17.6 | 52.0 | 30.4[2] |

[1] ethylene-vinyl acetate copolymeric vehicle solution from Example 1.
[2] ethyl cellulose vehicle solution, 10% by weight of ethyl cellulose in terpineol. Ethyl cellulose has 47.5–49.0% ethoxyl content and 2.42–2.53 ethoxyl groups per anhydroglucose units. Viscosity of the ethyl cellulose, after drying for 30 min. at 100° C. is 22 centipoises in a 5% by weight solution in 80/20//toluene/ethanol (by weight) solvent system.

These resistor compositions were fired at 900° C. (resistor fired at 800° C. show similar properties) peak temperature in a belt furnace. The properties of the resistors so obtained are tabulated below. As can be seen by these data, resistor compositions based on reducible oxide-containing glasses have poor electrical properties and excessive humidity drift.

X-ray diffraction of the fired resistor showed substantial amounts of Pb metal indicating the reducibility of the glass.

| Example | Resistivity (kohm/square) | CR (ppm/°C.) | CV (%) | Thickness (mil) | Smoothness (mil) |
|---------|---------------------------|--------------|--------|-----------------|-------------------|
| 14 | 3.4 | −1433 | 61 | 0.65 | 0.6 |
| 15 | 69.5 | −2056 | 48.3 | 0.70 | 0.4 |
| 16 | 45.7 | −4006 | 33 | — | — |
|  |  |  |  | (3.1% drift after 90% relative humidity/40° C./100 hr.) | |

I claim:

1. A thick film composition consisting essentially of inorganic powder solids content dispersed in an organic vehicle wherein the solids content consists essentially of:
   A. 10–95 parts by weight, based on the weight of solids, of conductive material selected from the group consisting of LaB$_6$, YB$_6$, rare earth hexaborides, CaB$_6$, BaB$_6$ and SrB$_6$; and
   B. 90–5 parts by weight, based on the weight of solids, of at least 98 mole %, based on the mole % of the oxide components of the glass, of nonreducible glass, each component having a Gibbs free energy of formation at 900° C. of less than approximately −78 kcal/mole per each metal-oxygen bond in the molecule;

wherein the composition is compatible with copper conductors and is fireable in substantially nonoxidizing atmosphere.

2. The composition of claim 1 wherein said conductive material is LaB$_6$.

3. The composition of claim 2 wherein the average particle size of LaB$_6$ is below 1 micron.

4. The composition of claim 3 wherein the average particle size of LaB$_6$ is 0.055–0.32 micron.

5. The composition of claim 1 wherein said nonreducible glass is based on nonreduciole oxides selected from the group consisting of CaO, ThO$_2$, BeO, La$_2$O$_3$, SrO, MgO, Y$_2$O$_3$, rare earth oxides, Sc$_2$O$_3$, BaO, HfO$_2$, ZrO$_2$, Al$_2$O$_3$, Li$_2$O, TiO$_2$, CeO$_2$, SiO$_2$ and B$_2$O$_3$.

6. The composition of claim 1 wherein said nonreducible glass contains
   10–30 mole % of at least one of CaO, BaO and SrO;
   35–55 mole % of SiO$_2$;
   20–35 mole % of B$_2$O$_3$;
   5–15 mole % of Al$_2$O$_3$;
   0–4 mole % of ZrO$_2$; and
   0–1 mole % of TiO$_2$.

7. The composition of claim 6 wherein the oxide present at the 10–30 mole % level is CaO.

8. A thick film composition consisting essentially of inorganic powder solids content dispersed in an organic vehicle wherein the weight ratio of solids content to vehicle is from 1:2 to 20:1 and wherein the solids content consists essentially of
   A. 10–95 parts weight, based on the weight of solids, of LaB$_6$ having an average particles size below 1 micron; and
   B. 90–5 parts by weight, based on the weight of solids, of at least 98% mole %, based on the mole % of the oxide components of the glass, of nonreducible glass containing
   10–30 mole % of at least one of CaO, BaO and SrO;
   35–55 mole % of SiO$_2$
   20–35 mole % of B$_2$O$_3$;
   5–15 mole % of Al$_2$O$_3$;
   0–4 mole % of ZrO$_2$; and
   0–1 mole % of TiO.

9. An electrical resistive material which is stable in a nonoxidizing firing atmosphere, comprising a mixture of glass frit and metal hexaboride selected from the group consisting of LaB$_6$, YB$_6$, rare earth hexaborides, CaB$_6$, BaB$_6$, and SrB$_6$, characterized in that the glass is formed from component oxides having a Gibbs free energy of formation at 900° C. of less than approximately −78 kcal/mole per each metaloxygen bond in the molecule comprising alkaline earth metal oxides, B$_2$O$_3$ and Al$_2$O$_3$.

10. An electrical resistive material as claimed in claim 9, characterized in that the glass is a calcium boroaluminate.

11. An electrical resistive material as claimed in claim 9 or claim 10, characterized in that it contains a mixture of hexaborides of a divalent metal and of a metal which is at least trivalent.

12. An electrical resistive material as claimed in claim 9 or claim 10, characterized in that the glass has present therein less than 2 mole % of reducible metal oxide.

13. An electrical resistive material as claimed in claim 11 characterized in that the glass has present therein less than 2 mole % of reducible metal oxide.

14. An electrical resistive material as claimed in claim 9 or claim 10 characterized in that the glass has present therein less than 2 mole % of $Bi_2O_3$.

15. An electrical resistive material as claimed in claim 11 characterized in that the glass has present therein less than 2 mole % of $Bi_2O_3$.

16. A screen printing paste produced by dispersing the electrical resistive material as claimed in claim 9 or claim 10 in an organic vehicle.

17. A screen printing paste produced by dispersing the electrical resistive material as claimed in claim 11 in an organic vehicle.

18. A screen printing paste produced by dispersing the electrical resisitive material as claimed in claim 12 in an organic vehicle.

19. A screen printing paste produced by dispersing the electrical resistive material as claimed in claim 13 in an organic vehicle.

20. A screen printing paste produced by dispersing the electrical resistive material as claimed in claim 14 in an organic vehicle.

21. A screen printing paste as claimed in claim 16 wherein the vehicle consists of a solution of ethyl cellulose in terpineol.

22. A screen printing paste as claimed in claim 17 wherein the vehicle consists of a solution of ethyl cellulose in terpineol.

23. A screen printing paste as claimed in claim 18 wherein the vehicle consists of a solution of ethyl cellulose in terpineol.

24. A screen printing paste as claimed in claim 19 wherein the vehicle consists of a solution of ethyl cellulose in terpineol.

25. A screen printing paste as claimed in claim 20 wherein the vehicle consists of a solution of ethyl cellulose in terpineol.

26. A substrate bearing a screen printed film produced by firing a paste as claimed in claim 16 in a nonoxidizing atmosphere at a peak temperature of approximately 910° C.

27. A substrate bearing a screen printed film produced by firing the paste as claimed in claim 17 in a nonoxidizing atmosphere at a peak temperature of approximately 910° C.

28. A substrate bearing a screen printed film produced by firing the paste as claimed in claim 18 in a nonoxidizing atmospheere at a peak temperature of approximately 910° C.

29. A substrate bearing a screen printed film produced by firing the paste as claimed in claim 19 in a nonoxidizing atmosphere at a peak temperature of approximately 910° C.

30. A substrate bearing a screen printed film produced by firing the paste as claimed in claim 28 in a nonoxidizing atmosphere at a peak temperature of approximately 910° C.

31. A screen printing paste produced by dispersing in an organic vehicle an electrical resistive material, containing a mixture of glass frit and metal hexaboride selected from the group consisting of $LaB_6$, $YB_6$, rare earth hexaborides, $CaB_6$, $BaB_6$, and $SrB_6$, characterized in that the glass is formed from component oxides having a Gibbs free energy of formation at 900° C. of less than $-78$ kcal/mole per each metal-oxygen bond in the molecule comprising alkaline earth metal oxides, $B_2O_3$ and $Al_2O_3$.

32. An electrical resistive material which is stable in a non-oxidizing firing atmosphere, containing a mixture of glass frit and divalent or trivalent metal hexaborides, characterized in that the glass is formed from component oxides having a Gibbs free energy of formation at 900° C. of less than approximately $-78$ kcal/mole per each metal-oxygen bond in the molecule comprising alkaline earth metal oxides, $B_2O_3$ and $Al_2O_3$.

33. A screen printing paste produced by dispersing in an organic vehicle an electrical resistive material, containing a mixture of glass frit and divalent or trivalent metal hexaborides, characterized in that the glass is formed from component oxides having a Gibbs free energy of formation at 900° C. of less than approximately $-78$ kcal/mole per each metal-oxygen bond in the molecule comprising alkaline earth metal oxides, $B_2O_3$ and $Al_2O_3$.

* * * * *